United States Patent
Botula et al.

(10) Patent No.: US 8,828,746 B2
(45) Date of Patent: Sep. 9, 2014

(54) COMPENSATION FOR A CHARGE IN A SILICON SUBSTRATE

(71) Applicant: International Business Machines Corporation, Armonk, NY (US)

(72) Inventors: Alan B. Botula, Essex Junction, VT (US); Mark D. Jaffe, Shelburne, VT (US); Alvin J. Joseph, Williston, VT (US); Richard A. Phelps, Colchester, VT (US); James Slinkman, Montpelier, VT (US); Randy L. Wolf, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/676,817

(22) Filed: Nov. 14, 2012

(65) Prior Publication Data

US 2014/0131800 A1    May 15, 2014

(51) Int. Cl.
    *H01L 21/02*    (2006.01)
(52) U.S. Cl.
    USPC ............. 438/14; 438/11; 438/15; 438/18
(58) Field of Classification Search
    CPC ................................ H01L 21/02488
    USPC .................... 438/11, 14, 15, 18, 479
    See application file for complete search history.

(56) References Cited

U.S. PATENT DOCUMENTS

| 7,843,005 | B2 | 11/2010 | Nowak |
| 7,927,963 | B2 | 4/2011 | Brown et al. |
| 8,026,131 | B2 | 9/2011 | Botula et al. |
| 8,129,787 | B2 | 3/2012 | Brindle et al. |
| 8,131,225 | B2 | 3/2012 | Botula et al. |
| 2010/0140758 | A1 | 6/2010 | Doherty et al. |
| 2011/0127529 | A1 | 6/2011 | Botula et al. |
| 2011/0131542 | A1 | 6/2011 | Botula et al. |
| 2012/0025345 | A1 | 2/2012 | Botula et al. |

OTHER PUBLICATIONS

Kerr, D.C. et al., "Paper published in the Topical Meeting on Silicon Monolithic Integrated Circuits in RF Systems", 2008. SiRF 2008. IEEE Date of Conference: Jan. 23-25, 2008 at RFMD, Greensboro, NC, in pp. 151-154.
IQE, "Product data sheet: Silicon on Insulator (SOI)" IQE Silicon Compounds Ltd., Oct. 10, 2011, 1 page.
International Search Report and Written Opinion for related PCT Application No. PCT/US13/57962, dated Apr. 21, 2014, pp. 1-13.

*Primary Examiner* — Tran Tran
(74) *Attorney, Agent, or Firm* — Cantor Colburn LLP; Michael LeStrange

(57) ABSTRACT

A silicon device includes an active silicon layer, a buried oxide (BOX) layer beneath the active silicon layer and a high-resistivity silicon layer beneath the BOX layer. The device also includes a harmonic suppression layer at a boundary of the BOX layer and the high-resistivity silicon layer.

18 Claims, 4 Drawing Sheets

COMPENSATION FOR A CHARGE IN A SILICON SUBSTRATE

BACKGROUND

The present disclosure relates to compensating for a charge in a silicon substrate. In particular, the present disclosure relates to forming a harmonic suppression layer at a boundary of a buried oxide (BOX) layer and a silicon substrate.

A silicon wafer for forming semiconductor devices may be formed by providing a silicon substrate and doping a layer of the silicon substrate with oxygen to form a buried oxide (BOX) layer between a thin active silicon layer and a handle substrate layer. The handle substrate layer may be manufactured to have a high resistivity, such as by doping the handle substrate layer. When oxygen is introduced into the handle substrate layer in the crystal manufacturing process, the oxygen may result in undesirable effects in semiconductor circuitry formed in the thin active silicon layer. In particular, when oxygen in the handle substrate near the border of the BOX layer is annealed, as during the semiconductor manufacturing process, the oxygen may generate donor complexes that provide free electrons, resulting in the generation of harmonics when semiconductor circuitry in the thin active silicon layer operates at a radio frequency (RF).

Harmonic generation is minimized when free carriers are minimized in the handle substrate layer near the BOX layer. The carrier concentration near the surface of the handle substrate depends on the charge at the oxide interface, substrate resistivity and carrier type, and interstitial oxygen concentration together with annealing history.

Generally, manufacturers of silicon wafers provide guarantees that resistivity of the substrate doping falls within certain bounds, and that oxygen in the handle substrate will be less than a predetermined amount. In addition, effort is made to minimize variation in oxide interface charge. However, these parameters will vary between manufacturers and between batches supplied from the same manufacturer. For example, interstitial oxygen may be specified as less than ten (10) parts per million atoms (ppma). Even so, small amounts of oxygen in the handle substrate, such as around four (4) ppma or greater may adversely affect performance of semiconductor circuitry, depending on a resistivity of the handle substrate.

SUMMARY

Embodiments of the disclosure include a silicon device including an active silicon layer and a buried oxide (BOX) layer beneath the active silicon layer. A high-resistivity silicon layer is located beneath the BOX layer and a harmonic suppression layer is located at a boundary of the BOX layer and the high-resistivity silicon layer.

Embodiments further include a method of countering defects in a silicon device. The method includes measuring a resistivity of a silicon wafer, determining a charge at a boundary of a buried oxide (BOX) layer and a silicon substrate layer based on the measured resistivity, and injecting charged particles into the silicon wafer at the boundary of the BOX layer and the silicon substrate to counter the determined charge.

Embodiments further include a computer program product comprising a tangible computer readable medium having stored thereon a computer program for executing a method when executed by a processor. The method includes measuring a resistivity of a silicon wafer and determining a charge at a boundary of a buried oxide (BOX) layer and a silicon substrate layer in the wafer based on the measured resistivity. The method further includes injecting charged particles into the silicon wafer at the boundary of the BOX layer and the silicon substrate to counter the determined charge.

Additional features and advantages are realized through the techniques of the present disclosure. Other embodiments and aspects of the present disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter of the disclosure is particularly pointed out and distinctly claimed in the claims at the conclusion of the specification. The forgoing and other features, and advantages of the disclosure are apparent from the following detailed description taken in conjunction with the accompanying drawings in which:

DETAILED DESCRIPTION

Silicon devices may include a charged region at a boundary between a buried oxide (BOX) layer and a handle substrate. The charged region may be caused, for example, by surface state charge at the BOX-silicon interface. The charged region may lead to undesirable circuit characteristics, such as the generation of harmonics when operating semiconductor circuitry of silicon devices at radio frequencies (RF). Embodiments of the present disclosure relate to compensating for the charged region by doping the boundary where the charged region is located.

Figure 1:
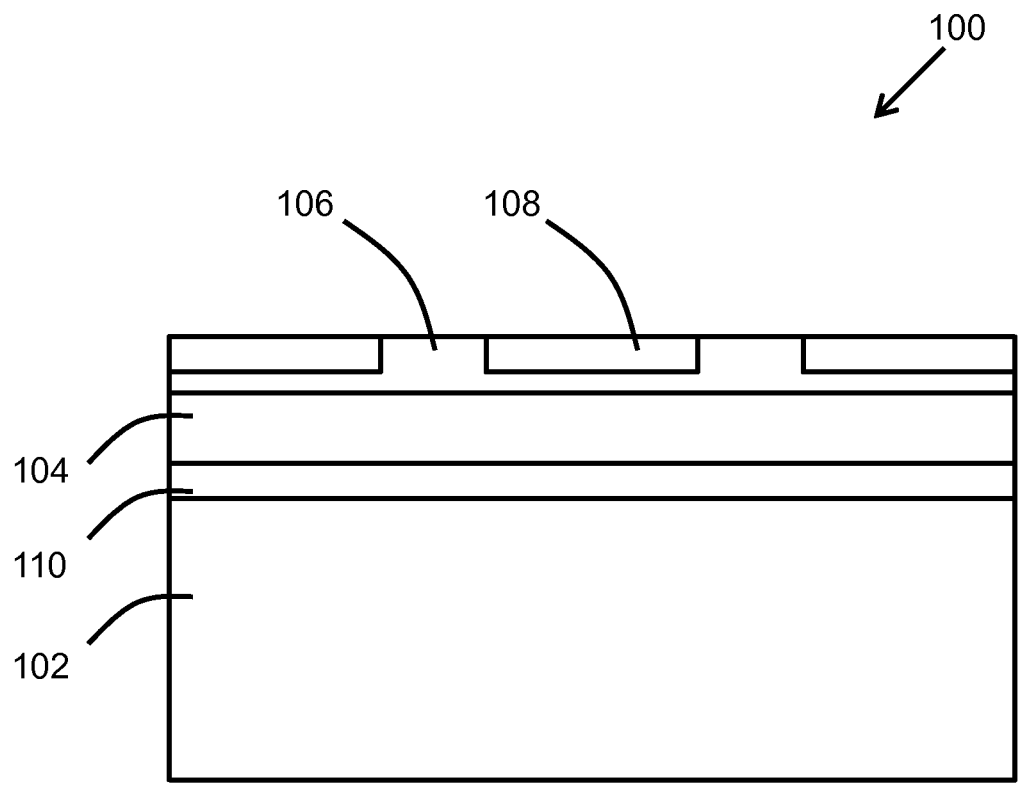
FIG. 1 illustrates a silicon device according to an embodiment of the present disclosure.

FIG. 1 illustrates a silicon device 100 according to embodiments of the present disclosure. The silicon device 100 includes a handle substrate 102, a buried oxide (BOX) layer 104 and a thin active silicon layer 106 in which semiconductor devices 108 and circuitry may be formed. The handle substrate 102 may be a high-resistivity substrate, such as a substrate having a resistivity of 1000 Ohm-cm or greater. The handle substrate 102 may be a silicon substrate, and in one embodiment the handle substrate is a p-type substrate. In one embodiment, the handle substrate is doped with boron, or another positively-charged ion.

The BOX layer 104 may be, for example, silicon oxide $SiO_2$, or silicon doped with oxygen. The BOX layer 104 may be formed as an insulator layer between the thin active silicon layer 106 and the handle substrate 102. The thin active silicon layer 106 may have semiconductor circuits, devices or parts formed in or on the active silicon layer 106. In addition, other wiring and circuitry may be formed in or on the active silicon layer 106.

In embodiments of the present disclosure, a harmonics suppression layer 110 is formed at a boundary of the BOX layer 104 and the handle substrate 102. The harmonics suppression layer 110 may be a layer of charged particles inserted, doped or injected into the silicon device 100 after the BOX layer 104 is formed. In one embodiment, the handle substrate 102 is a p-type substrate, and the harmonic suppression layer 110 includes positively-charged ions, such as boron ions. However, embodiments of the disclosure encompass both p- and n-type substrates, and the harmonic suppression layer 110 may comprise either positively- or negatively-charged ions.

In one embodiment, the harmonic suppression layer 110 has a thickness in a range from about 0.3 microns (μm) to 1 μm thick. In one embodiment, the harmonic suppression layer 110 is around 0.5 μm thick. In one embodiment, the harmonic suppression layer 110 is located around 20 μm or less from an upper surface of the thin active silicon layer 106.

In one embodiment, the handle substrate 102, BOX layer 104 and thin active silicon layer 106 are annealed prior to formation of the harmonic suppression layer 110. The harmonic suppression layer 110 may be formed based on measured characteristics of the annealed handle substrate 102, BOX layer 104 and thin active silicon layer 106. For example, the harmonic suppression layer 110 may be formed based on a measured resistivity of the handle substrate 102.

Figure 2:
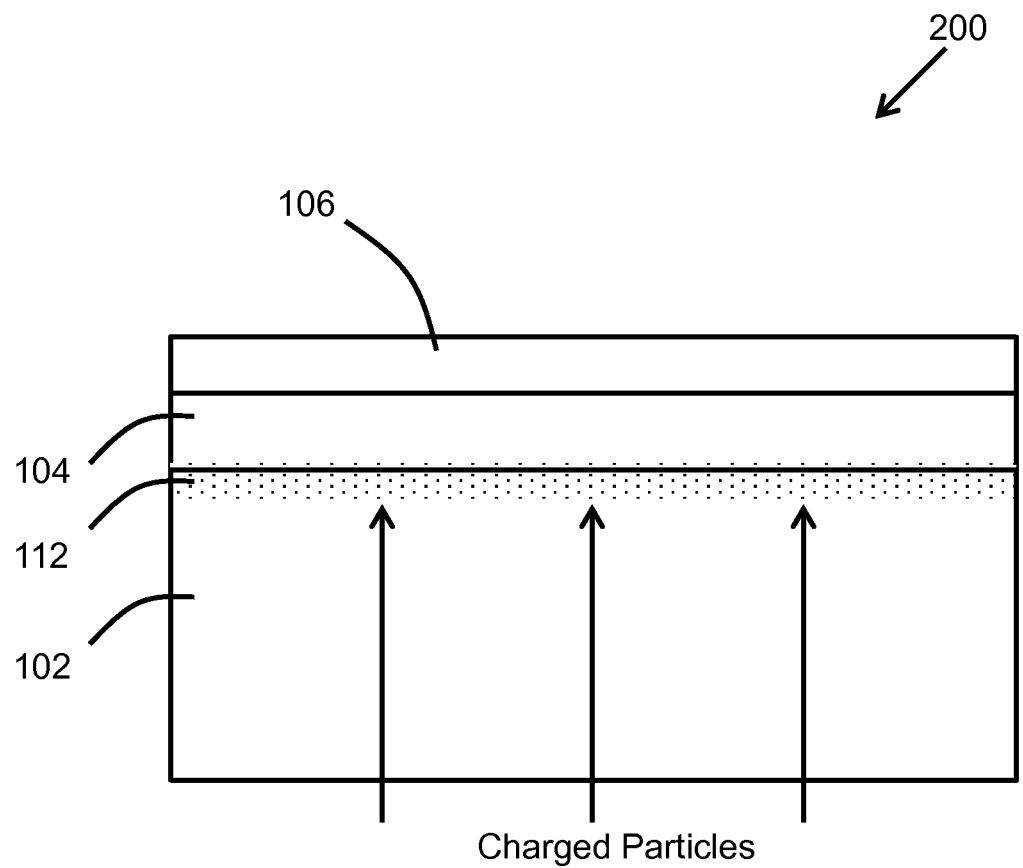
FIG. 2 illustrates forming a harmonic suppression layer according to an embodiment.

FIG. 2 illustrates forming the harmonic suppression layer in an interim silicon device 200 according to an embodiment of the disclosure. Prior to forming the harmonic suppression layer, a layer of positive charge may exist at the boundary of the handle substrate 102 and the BOX layer 104. The layer of charge may be due to, for example, oxygen atoms, or molecules including oxygen atoms, introduced during fabrication of the interim silicon device 200. The charged particles may result in a negatively charged layer 112 including free electrons. The negatively charged layer 112 may lead to the generation of harmonics when a silicon device operates at radio frequencies (RF). In one embodiment, the interim silicon device 200 represents an annealed device.

Charged particles having a polarity opposite the charged layer 112 may be injected into the interim silicon device 200, such as via the handle substrate 102. In an embodiment in which the layer 112 represents free electrons having a negative charge, the charged particles that are injected into the handle substrate 102 to neutralize the layer 112 of free electrons may be positively charged. In one embodiment, the charged particles are positively-charged ions, such as boron ions.

In one embodiment, prior to introducing the charged particles, a resistivity of the handle substrate 102 is measured. The quantity or density of charged particles may be adjusted or determined based on the measured resistivity. In one embodiment, the harmonic suppression layer 110 is formed to have a charge density between 1.5e11 cm$^{-2}$ and 4e11 cm$^{-2}$.

Figure 3:
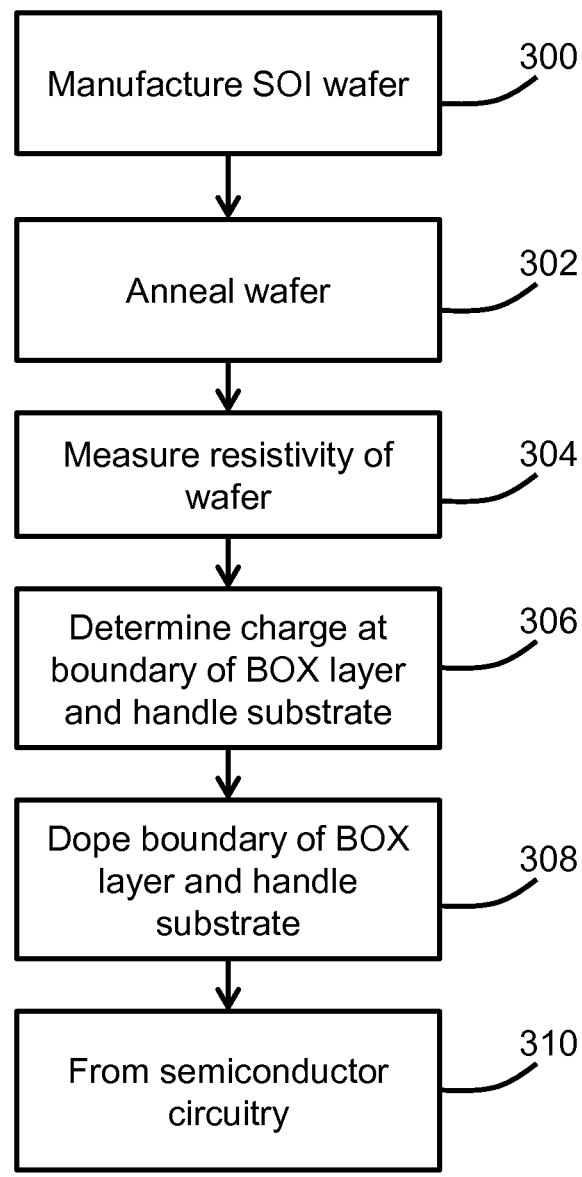
FIG. 3 is a flowchart illustrating a process for forming a harmonic suppression layer according to an embodiment.

FIG. 3 illustrates a process for compensating for charged particles in a silicon device according to one embodiment. In block 300, a silicon-on-insulator (SOI) wafer is manufactured. Manufacturing the SOI wafer may include annealing the SOI wafer in block 302. The annealing may be performed to account for the effect of oxygen donor generation during semiconductor processing. The SOI wafer may include a handle substrate, a BOX layer formed on the handle substrate, and a thin active silicon layer on the BOX layer. Although the introduction of oxygen into the handle substrate during manufacturing may be minimized, inevitably some oxygen is formed in the handle substrate, which may affect harmonics characteristics of the SOI wafer.

In block 304, a resistivity of the wafer is measured. Measuring the resistivity of the wafer may include measuring the resistivity of the handle substrate. In block 306, a charge at a boundary of the buried oxide (BOX) layer and the handle substrate layer of the SOI wafer is determined. The charge may be determined based on the measured resistivity. The charge may also be determined based on manufacturing specifications. For example, a manufacturer may provide a specification that the wafer will have a parts per million atoms (ppma) of oxygen in the handle substrate within a predetermined range. In one embodiment, the predetermined range is less than 10 ppma (or 0-10 ppma) oxygen. In another embodiment, the predetermined range is less than 6 ppma oxygen. Accordingly, the charge may be determined based on the measured resistivity and the specification provided by the manufacturer.

In block 308, charged particles may be provided at the boundary of the BOX layer and the handle substrate to dope the boundary and to form a harmonic suppression layer. The spatial distribution or quantity of the charged particles may vary based on the determined charge in the boundary region. In one embodiment, the harmonic suppression layer is formed by injecting positively-charged ions, such as boron ions, into the handle substrate to a predetermined depth in the handle substrate.

In block 310, semiconductor circuitry may be formed in or on a thin active silicon layer of the silicon device. Semiconductor circuitry includes transistors, logic, wiring, and any other desired circuitry.

Figure 4:
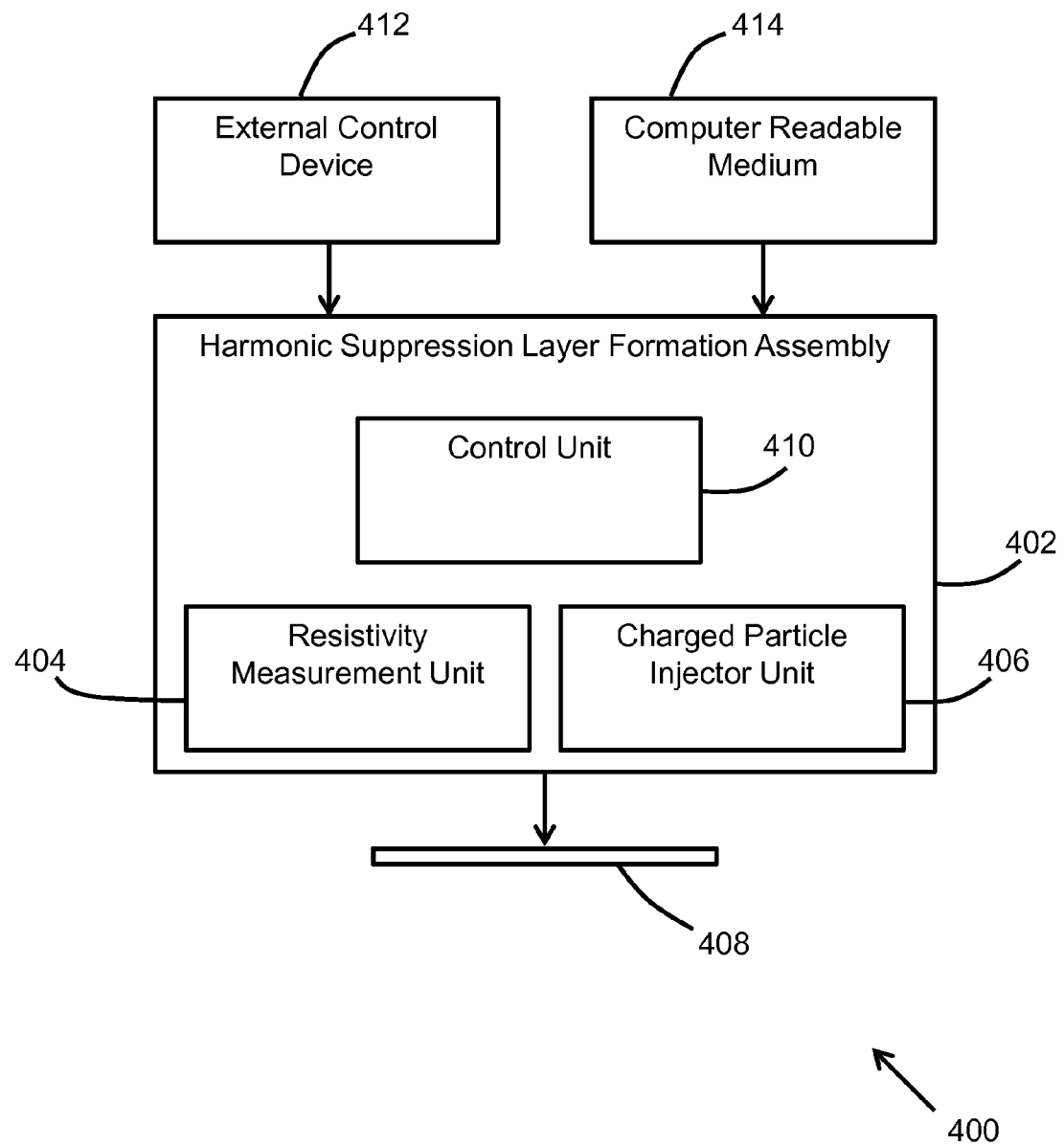
FIG. 4 illustrates a system for suppressing harmonics in a wafer according to one embodiment.

FIG. 4 illustrates a system 400 for forming a harmonic suppression layer according to one embodiment. The system 400 includes a harmonic suppression layer formation assembly 402. The assembly 402 may be one multi-purpose device, such as a device located within a same housing or connected by physical structures, or the assembly 402 may include multiple, separate devices, modules and computers. The harmonic suppression layer formation assembly 402 includes a resistivity measurement unit 404 and a charged particle injector unit 406.

The resistivity measurement unit 404 is configured to measure a resistivity of the wafer 408. Based on the measured resistivity, the charged particle injector unit 406 may inject charged particles into the wafer 408 to form the harmonic suppression layer in the wafer 408. Accordingly, the wafer 408 may correspond to the silicon device 100 of FIG. 1 and the interim silicon device 200 of FIG. 2.

Calculations and algorithms for controlling the resistivity measurement unit 404 and the charged particle injector unit 406 may be stored in memory in a control unit 410, in an external control device 412 or in a computer readable medium 414. For example, the control unit 410, external control device 412 or the computer readable medium 414 may store specifications regarding a concentration of oxygen atoms in the wafer 408, and the specifications, along with the measured resistivity, may be used to determine a level of charged particles supplied to the wafer 408 to form the harmonic suppression layer.

Although described embodiments relate to forming a harmonic suppression layer in a same wafer as a measured resistivity, embodiments of the present disclosure encompass forming the harmonic suppression layer in one or more wafers other than the wafer having the resistivity measured. For example, in one embodiment, the resistivity may be measured in a sample wafer in a batch, and the remaining wafers in the batch may have a harmonic suppression layer formed based on the measured characteristics in the sample wafer.

As described above, embodiments can be embodied in the form of computer-implemented processes and apparatuses for practicing those processes. An embodiment may include a computer program product on a computer readable/usable medium with computer program code logic containing instructions embodied in tangible media as an article of manufacture. Exemplary articles of manufacture for computer readable/usable medium may include floppy diskettes, CD-ROMs, hard drives, universal serial bus (USB) flash drives, or any other computer-readable storage medium, wherein, when the computer program code logic is loaded into and executed by a computer, the computer becomes an apparatus for practicing the embodiments. Embodiments include computer program code logic, for example, whether stored in a storage medium, loaded into and/or executed by a computer, or transmitted over some transmission medium, such as over electrical wiring or cabling, through fiber optics, or via electromagnetic radiation, wherein, when the computer program code logic is loaded into and executed by a computer, the computer becomes an apparatus for practicing the embodiments. When implemented on a general-purpose microprocessor, the computer program code logic segments configure the microprocessor to create specific logic circuits.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention to the particular embodiments described. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosed embodiments. Many modifications and variations will be apparent to those of ordinary skill in the art without departing from the scope and spirit of the embodiments of the present disclosure.

While preferred embodiments have been described above, it will be understood that those skilled in the art, both now and in the future, may make various improvements and enhancements which fall within the scope of the claims which follow.

The invention claimed is:

1. A method of suppressing harmonics in a silicon device, comprising:
    measuring a resistivity of a silicon wafer;
    determining a charge at a boundary of a buried oxide (BOX) layer and a silicon substrate layer based on the measured resistivity; and
    injecting charged particles into the silicon wafer at the boundary of the BOX layer and the silicon substrate to counter the determined charge.

2. The method of claim 1, wherein determining the charge at the boundary of the BOX layer and the silicon substrate layer is based on the measured resistivity and a predefined charge associated with the silicon wafer.

3. The method of claim 2, wherein the predefined charge is a range specified by a manufacturer of the silicon wafer.

4. The method of claim 1, wherein the determined charge is a positive charge, and
    injecting charged particles into the silicon wafer includes injecting positively charged particles into the silicon wafer.

5. The method of claim 4, wherein the positively charged particles are boron ions.

6. The method of claim 1, wherein injecting the charged particles into the silicon wafer includes injecting charged particles to form a harmonic suppression layer having a charge between $1.5e11$ $cm^{-2}$ and $4e11$ $cm^{-2}$.

7. The method of claim 1, wherein injecting the charged particles into the silicon wafer includes injecting the charged particles to a depth of 20 μm or less from an upper surface of the silicon wafer.

8. The method of claim 1, wherein injecting the charged particles into the silicon wafer includes forming a harmonic suppression layer at the boundary of the BOX layer and the silicon substrate.

9. The method of claim 1, wherein determining the charge at the boundary of the BOX layer and the silicon substrate layer includes annealing the wafer to account for the effect of oxygen donor generation during semiconductor processing.

10. The method of claim 1, wherein the silicon substrate layer is a high-resistivity silicon substrate layer having a resistivity of 1000 ohm-cm or greater.

11. A computer program product comprising a tangible computer readable medium having stored thereon a computer program for executing a method when executed by a processor, the method comprising:
    measuring a resistivity of a silicon wafer;
    determining a charge at a boundary of a buried oxide (BOX) layer and a silicon substrate layer in the wafer based on the measured resistivity; and
    injecting charged particles into the silicon wafer at the boundary of the BOX layer and the silicon substrate to counter the determined charge.

12. The computer program product of claim 11, wherein determining the charge at the boundary of the BOX layer and the silicon substrate layer is based on the measured resistivity and a predefined charge associated with the silicon wafer.

13. The computer program product of claim 12, wherein the predefined charge is a range specified by a manufacturer of the silicon wafer.

14. The computer program product of claim 11, wherein the determined charge is a positive charge, and
    injecting charged particles into the silicon wafer includes injecting positively charged particles into the silicon wafer.

15. The computer program product of claim 11, wherein injecting the charged particles into the silicon wafer includes injecting charged particles to form a harmonic suppression layer having a charge between $1.5e11$ $cm^{-2}$ and $4e11$ $cm^{-2}$.

16. The computer program product of claim 11, wherein injecting the charged particles into the silicon wafer includes forming a harmonic suppression layer at the boundary of the BOX layer and the silicon substrate.

17. The computer program product of claim 16, wherein the harmonic suppression layer is formed to have a thickness of around 0.5 μm.

18. The computer program product of claim 11, wherein the silicon substrate layer is a high-resistivity silicon substrate layer having a resistivity of 1000 ohm-cm or greater.

* * * * *